United States Patent [19]

Kunihiro

[11] Patent Number: 4,748,481
[45] Date of Patent: May 31, 1988

[54] HOUSING FOR COPIER SEPARABLE INTO UPPER AND LOWER FRAMES

[75] Inventor: Hisashi Kunihiro, Nara, Japan

[73] Assignee: Sharp Kabushiki Kaisha, Osaka, Japan

[21] Appl. No.: 55,686

[22] Filed: May 29, 1987

[30] Foreign Application Priority Data

Jun. 11, 1986 [JP] Japan ............................. 61-88955[U]

[51] Int. Cl.⁴ ............................................ G03G 15/00
[52] U.S. Cl. ................................. 335/133; 355/3 DD
[58] Field of Search ............ 355/133, 3 DD; 220/315, 220/317, 318; 312/24, 244, 320

[56] References Cited

U.S. PATENT DOCUMENTS 2,675,290  4/1954  Berry ................................. 312/320
3,988,802  11/1976 Bruni et al. ......................... 312/320
4,376,579  3/1983  Wakao ................................ 355/133

FOREIGN PATENT DOCUMENTS 834013  5/1960  United Kingdom ................ 220/315

Primary Examiner—Monroe H. Hayes
Attorney, Agent, or Firm—Flehr, Hohbach, Test, Albritton & Herbert

[57] ABSTRACT

A housing for an apparatus such as a copier has an upper frame and a lower frame which are connected together but are separable from each other such that the upper frame is rotatable with respect to the lower frame to open and close the housing. The lower frame is provide with a handle which is normally contained in the lower frame but can be pulled out when it is desired to lift or transport the apparatus. A locking member is rotatably attached to the lower frame and is slidable engaged with a piece protruding from the upper frame such that the housing can be freely opened and closed if the handle is pushed into the lower frame but that the locking member assumes a position for securely locking the frames if the handle is pulled out of the lower frame.

6 Claims, 2 Drawing Sheets

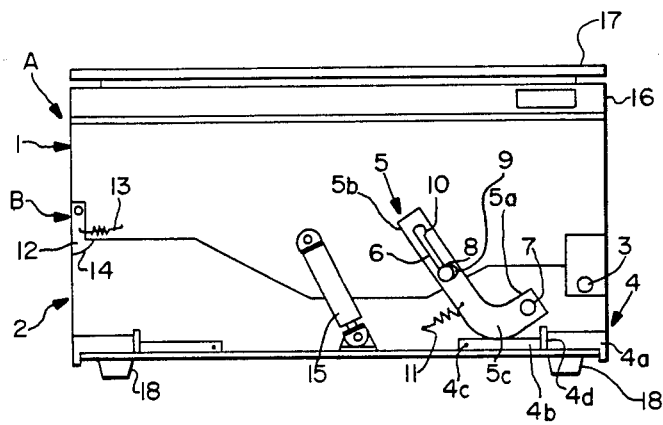
FIG.—1A
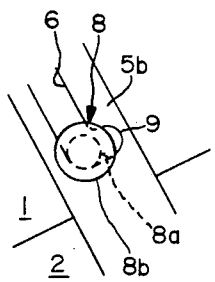
FIG.—1B
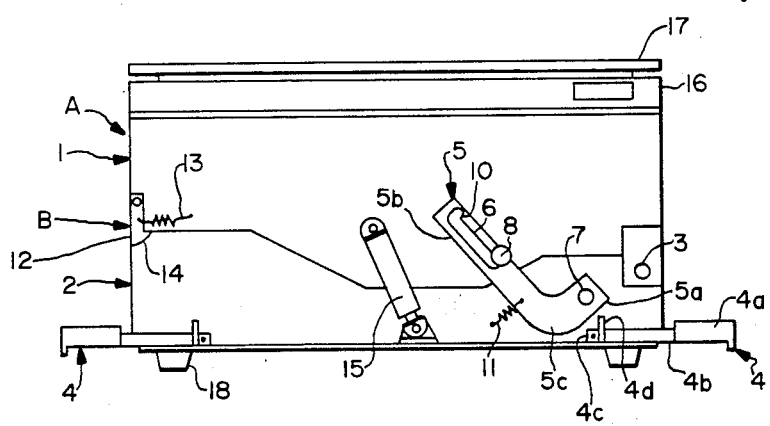
FIG.—2A
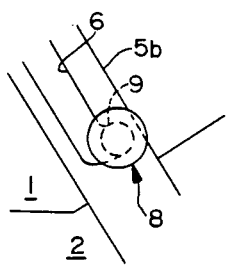
FIG.—2B

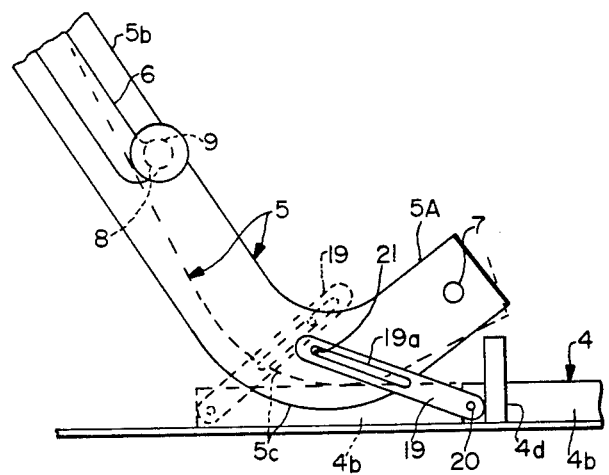
FIG.—3

001
HOUSING FOR COPIER SEPARABLE INTO UPPER AND LOWER FRAMES

BACKGROUND OF THE INVENTION

This invention relates to a housing for an apparatus such as a copier and more particularly to such a housing separable into upper and lower frames such that the upper frame can be moved relative to the lower frame to open and close the housing.

There have been copiers of the type with a housing separable into upper and lower frames such that a jammed sheet of copy paper can be removed easily by opening the upper frame to separate it from the lower frame. Such a copier may typically include a process unit contained in the upper frame and a paper transporting unit contained in the lower frame, the two frames being connected through an axis of rotation around which the upper frame can be rotated with respect to the lower frame to open or close the housing. Locking means including a hook and a notch may be provided on the distal side from the axis of rotation to keep the housing locked after the upper frame is closed with respect to the lower frame. With a conventional copier thus structured, the lock could become disengaged when a frame is distorted or a brunt force is applied on it such as when the copier is being transported.

SUMMARY OF THE INVENTION

It is therefore an object of the present invention to provide a housing for an apparatus such as a copier which can be separated into upper and lower frames but can be more reliably locked together such that the locking device does not become disengaged easily although the housing is subjected to a reasonably strong force when, for example, the copier is being transported.

The above and other objects of the present invention are achieved by providing a housing separable into upper and lower frames such that the upper frame can be rotated with respect to the lower frame to open and close the housing and that the frames become locked together when a handle which is normally contained inside the lower frame is pulled out from its contained position. Thus, when it is desired to move the apparatus by pulling out the handle, this very act of pulling out the handle causes the frames to become locked with respect to each other and the locking device will not become disengaged even if a fairly large brunt force is applied on the housing.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1A is a schematic side view of an apparatus with a housing embodying the present invention with the side panel removed to show its locking mechanism when the handle is contained in its frame, FIG. 1B is an enlarged view of a part of FIG. 1A, FIG. 2A is a schematic side view of the apparatus of FIG. 1A when the handle is pulled out such as when the apparatus is being transported, FIG. 2B is an enlarged view of a part of FIG. 2A, and FIG. 3 is a side view of a portion of another locking mechanism embodying the present invention.

Before the description of the present invention proceeds, it is to be noted that like parts are designated by like reference numerals throughout several views of the accompanying drawings.

DETAILED DESCRIPTION OF THE INVENTION

With reference to FIGS. 1 and 2, a generally box-shaped copier housing A consists of an upper frame 1 and a lower frame 2. The upper frame 1 serves as the process unit and contains a drive motor, a light exposure unit, a photosensitive unit, a developing unit, etc. (not shown) and the lower frame 2 serves as the paper transporting unit and contains devices for directing copy paper sheet to the aforementioned light exposure unit, the developing unit, etc. The upper frame 1 is rotatably connected to the lower frame 2 by means of a connecting axis 3 such that the housing A can be freely opened and closed. At the four bottom corners of the lower frame 2 are retractable handles 4 which are normally stored inside the lower frame 2 (hidden positions) and by means of which the housing A can be lifted or transported from one place to another. Numeral 5 indicates a locking member spanning both the upper frame 1 and the lower frame 2. An elongated hole 6 is formed at the upper part of the locking member 5. The lower part of the locking member 5 is rotatably supported by the lower frame 2 around a supporting axis 7. A sliding piece 8 which protrudes from the upper frame 1 engages slidably in the aforementioned elongated hole 6 formed in the locking member 5. The locking member 5 is so disposed as to rotate around the supporting axis 7 when one of the handles associated therewith is pulled out of or pushed into the lower frame 2. The elongated hole 6 has a locking notch 9 formed perpendicularly to its length from one of its ends in the direction of the connecting axis 3 as can be seen best in FIG. 1B such that the sliding piece 8 protruding from the upper frame 1 moves thereinto as shown in FIG. 2B when the associated handle 4 is pulled out of the lower frame 2 as shown in FIG. 2A. The connecting axis 3 is disposed at the right-hand edge (with respect to FIGS. 1A and 2A) of the upper and lower frames 1 and 2.

Each of the handles 4 is comprised of a bar-shaped holder 4a and a guide rod 4b which is connected to the inner end of the holder 4a and has a diameter smaller than that of the holder 4a. A small stopper 4c which is a protrusion is provied at the inner end of the guide rod 4b. A stopper wall 4d which is a protrusion from the lower frame 2 is provided to serve both as a guide for the sliding motion of the guide rod 4b and to strike against the aforementioned stopper protrusion 4c when the handle 4 is pulled out, thereby preventing the handle 4 from coming off completely from the lower frame 2. When the handle 4 is pushed in, the stopper wall 4d serves to hit the inner end surface of the holder 4a as shown in FIG. 1A, thereby preventing the handle 4 from moving too deeply into the lower frame 2.

The locking member 5 is approximately L-shaped with a support piece 5a, a guide piece 5b and a curved section 5c connected together. The support piece 5a points in the direction of the connecting axis 3 and is supported by the supporting axis 7 near its end section. The guide piece 5b includes the elongated hole 6 at its end section. The locking member 5 is so designed and positioned as a whole that the lower edge of its curved section 5c touches the upper edge of the guide rod 4b nearly at the center along its length when the handle 4 is in the pushed-in position.

At the top end of the elongated hole 6 is another notch 10 formed perpendicularly to its length in the direction of the connecting axis 3. When the upper frame 1 is opened, the sliding piece 8 becomes engaged in this notch 10 to maintain the upper frame 1 in this open position. The sliding piece 8 is comprised of a small diameter part 8a to pass through the elongated hole 6 and large diameter disk parts 8b on both ends to prevent disengagement from the hole 6.

The locking member 5 is also provided with a biasing spring 11 connecting its guide piece 5b with the lower frame 2 such that a downward biasing force is applied to the locking member 5 around the supporting axis 7. The biasing force of this spring 11 is so adjusted that the sliding piece 8 can slide into the locking notch 9 when the associated handle 4 is pulled out as shown in FIGS. 2A and 2B.

On the left-hand side of the housing A (opposite from the connecting axis 3), there is provided another locking device B of a conventional type comprised of a latch 12 and a spring 13 on the upper frame 1 and an engaging notch 14 on the lower frame 2. With reference both to FIGS. 1A and 1B, numeral 15 indicates a balancer containing therein a shock absorber spring for constantly applying an upward biasing force tending to open the upper frame 1, thereby preventing the upper frame 1 from closing suddenly. Numeral 16 indicates a control panel, numeral 17 indicates a cover for preventing light from escaping and numerals 18 indicate support legs.

When it is desired to move the housing A thus structured, each of the handles 4 is pulled out of the lower frame 2. When one of the handles 4 associated with the locking mechanism of the present invention is pulled out, the curved section 5c of the locking member 5 becomes separated from the guide rod 4b and the locking member 5 rotates around the supporting axis 7 in the downward direction by the biasing force of the biasing spring 11. The sliding piece 8 thereupon slides into and fits inside the locking notch 9 as shown in FIG. 2B, becoming prevented from sliding along the elongated hole 6. Since the locking notch 9 is formed perpendicularly to the length of the hole 6 and since the locking member 5 is adapted to undergo a circular motion around the supporting axis 7, the locking member 5 in this situation serves to firmly lock the upper frame 1 and the lower frame 2 together. Thus, the upper frame 1 will not open even if a fairly large brunt force is applied to the housing A while it is being transported.

After the housing A has been set, each handle 4 is pushed into the lower frame 2. When the one associated with the locking mechanism is pushed in, the guide rod 4b lifts the locking member 5, rotating it upward around the supporting axis 7. Accordingly, the sliding piece 8 moves out of the locking notch 9 to the bottom end of the elongated hole 6 as shown in FIG. 1B. In other words, the sliding piece 8 can now be moved along the elongated hole 6 if the locking device B on the other side of the housing A is undone and the upper frame 1 is lifted, that is, the housing A can now be opened.

FIG. 3 shows a portion of another locking member 5 according to the present invention characterized as having its curved section 5c and the guide rod 4b connected by a connecting piece 19 having an elongated hole 19a along its length and pins 20 and 21 at its ends such that the biasing spring 11 of FIGS. 1A and 2A is dispensed with. When the handle 4 is pushed in (as shown by broken lines), the locking member 5 is rotated upward around the supporting axis 7 by means of the guide rod 4b, releasing the lock. If the handle 4 is pulled out (as shown by solid lines), the connecting piece 19 causes the locking member 5 to rotate downward around the supporting axis 7 to establish a locked condition.

The foregoing description of the invention has been presented for purposes of illustration and description. It is not intended to be exhaustive or to limit the invention to the precise form disclosed, and many modifications and variations are possible in light of the above teaching. For example, the housing A may include more than one locking member and the locking member need not necessarily be shaped as disclosed herein. In summary, a locking member rotates around a supporting axis according to the present invention when one of the holding handles is pulled out of its normal hiding position, thereby causing a sliding piece to slide inside an elongated hole and into a notch such that the upper and lower frames of the housing become securely locked with respect to each other and do not become disengaged easily even if a fairly large brunt force is applied to the housing.

What is claimed is:

1. In a housing for an apparatus separable into an upper frame and lower frame which are connected to each other around a connecting axis such that said upper frame can be rotated with respect to said lower frame around said connecting axis to open and close said housing, said lower frame containing a handle which can be pulled out of said lower frame, the improvement wherein said housing further comprises a locking member in contact with both said upper frame and said lower frame, an upper part of said locking member being formed with an elongated hole, said locking member being supported by said lower frame rotatably around a supporting axis, and a sliding piece protruding from said upper frame and being slidably engaged with said locking member through said elongated hole, said locking member being adapted to rotate around said supporting axis when said handle is pulled out of said lower frame or pushed into said lower frame, and said elongated hole being formed with a notch such that said sliding piece engages with said notch when said handle is pulled out of said lower frame.

2. The housing of claim 1 wherein said locking member is L-shaped, having a curved mid-section which is adapted to come into contact with said handle when said handle is pushed into said lower frame.

3. The housing of claim 1 further comprising a biasing spring connecting said locking member with said lower frame.

4. The housing of claim 1 further comprising an elongated connecting piece with one end rotatably attached to said handle and the other end in a slidably engaged relationship with said locking member.

5. The housing of claim 1 further comprising a locking mechanism including a latch disposed at a distal side of said housing from said connecting axis.

6. The housing of claim 1 wherein said notch is formed in the direction of said connecting axis from said elongated hole.

* * * * *

UNITED STATES PATENT AND TRADEMARK OFFICE
CERTIFICATE OF CORRECTION

PATENT NO.   : 4,748,481
DATED        : May 31, 1988
INVENTOR(S)  : Hisashi Kunihiro It is certified that error appears in the above—identified patent and that said Letters Patent is hereby corrected as shown below:

In the title page, lines 5-6 of the ABSTRACT, change "provide" to --provided--; line 9, change "slidable" to --slidably--.

Column 2, approximately line 49, change "provied" to --provided--.

Signed and Sealed this

Eighth Day of November, 1988

Attest:

DONALD J. QUIGG

*Attesting Officer*   Commissioner of Patents and Trademarks